(12) United States Patent
Luu

(10) Patent No.: US 6,225,864 B1
(45) Date of Patent: May 1, 2001

(54) RF AMPLIFIER HAVING A DUAL SLOPE PHASE MODULATOR

(75) Inventor: Ky Thoai Luu, Quincy, IL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/431,811

(22) Filed: Nov. 2, 1999

(51) Int. Cl.$^7$ ........................................... H03F 3/38
(52) U.S. Cl. ..................... 330/10; 332/144; 327/246
(58) Field of Search ..................... 330/10; 332/144, 332/146; 327/246, 247, 258, 276, 280

(56) References Cited

U.S. PATENT DOCUMENTS

| | | | |
|---|---|---|---|
| 4,415,863 | * 11/1983 | Tokumo .................................. | 330/10 |
| 4,968,948 | * 11/1990 | Tokumo et al. ......................... | 330/10 |
| 5,014,016 | * 5/1991 | Anderson ................................ | 330/10 |
| 5,389,829 | * 2/1995 | Milazzo ................................. | 327/172 |
| 6,130,528 | * 10/2000 | Aoyama ................................. | 323/282 |

\* cited by examiner

Primary Examiner—Robert Pascal
Assistant Examiner—Henry Choe

(74) Attorney, Agent, or Firm—Tarolli, Sundheim, Covell, Tummino & Szabo L.L.P.

(57) ABSTRACT

An RF amplifier system and method are presented herein for varying the phase of an RF signal made up of a first train of pulses exhibiting a fixed frequency and fixed duty pulse cycle and wherein each pulse is of a fixed amplitude and duration. An integrator converts each pulse cycle of the RF signal into a dual slope symmetrical ramp signal. A first level signal and a second level signal are provided and are equally spaced from a reference level. The dual slope ramp signal is compared with the first and second level signals. A first pulse signal is provided for a time duration corresponding with the time duration that the ramp signal exceeds the first level signal and a second pulse signal is provided for a time duration corresponding with the time duration that the second level signal exceeds the ramp signal. First and second pulse generators respectively receive the first and second pulse signals and provide first and second trigger pulses. A bistable circuit responds to the first and second trigger pulses to be in respective first and second states and provide an output RF signal made up of a second train of pulses shifted in phase from the first train by an amount related to the magnitude of the first level signal or the second level signal.

37 Claims, 3 Drawing Sheets

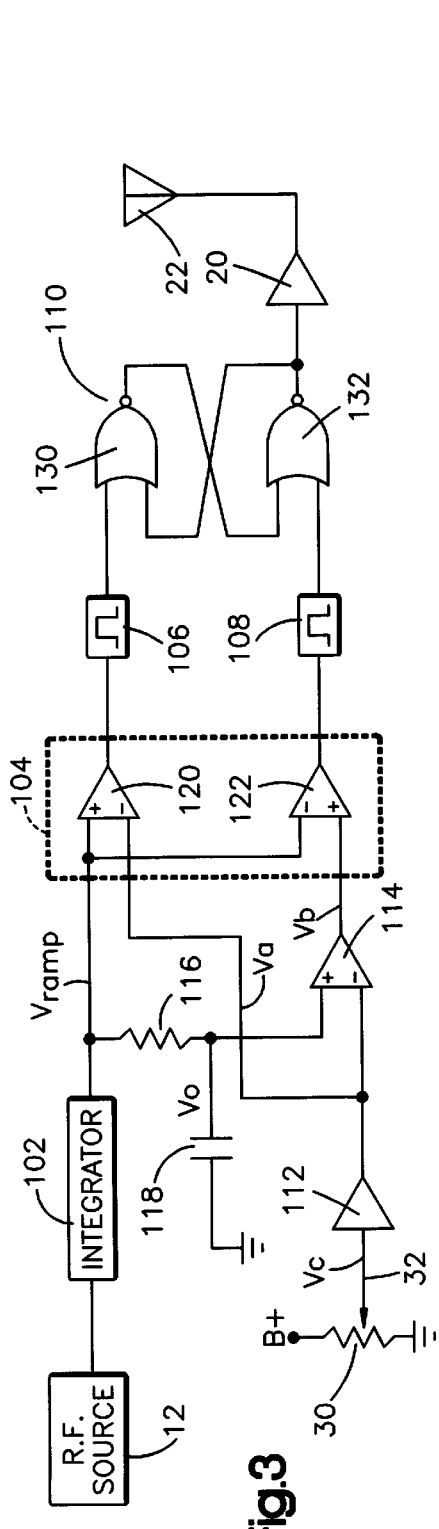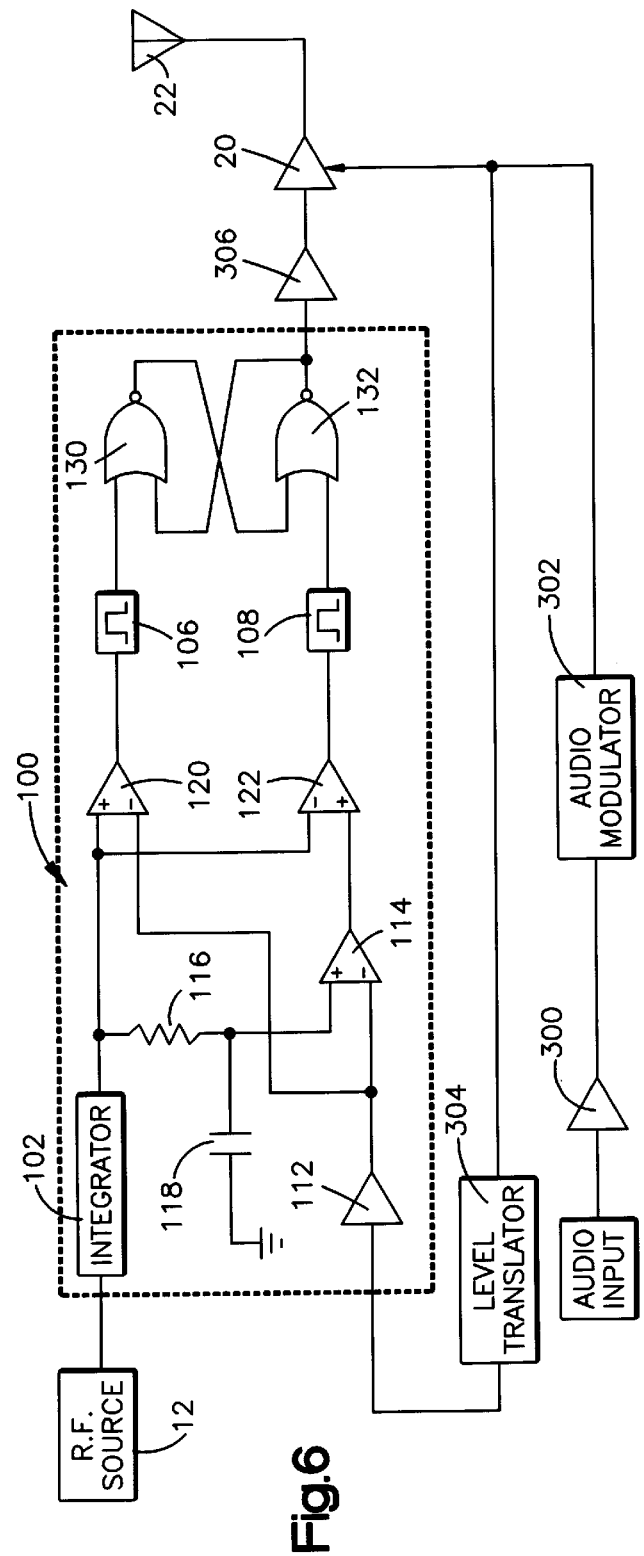

RF AMPLIFIER HAVING A DUAL SLOPE PHASE MODULATOR

BACKGROUND OF THE INVENTION

1. Technical Field

This invention relates to the art of RF amplifiers and, more particularly, to an RF amplifier having a dual slope phase modulator for varying the phase of an RF signal.

2. Description of the Prior Art

It has been observed in an AM transmitter that the RF carrier signal may become shifted in phase because of variations in the level of audio modulation. This may result in distortions particularly in digital radio broadcasting. It is an objective to provide RF phase predistortion to compensate for any phase error caused by an amplitude modulation system. This should be accomplished without changing the duty cycle (mark to space ratio) of the output RF signal as compared with the input RF signal.

It has been known in the prior art to phase shift an RF signal. One example of a phase shifting circuit is illustrated in FIG. 1 to which attention is now directed. In this version, an RF signal made up of a train of pulses 10 is obtained from a suitable RF source 12. This RF signal is supplied by way of a phase shifting circuit to an RF transmitter, including a power amplifier 20, and, thence, to an antenna 22. The phase shifting circuit includes a potentiometer including a resistor portion 30 connected between ground and a B+ voltage supply source and an adjustable wiper arm 32 which applies a control level signal, such as $V_c$, by way of an inductor 34 to a junction point 36. This junction point is fed with the RF signal by way of a capacitor 40 and a resistor R1. A tuning diode CR1 is connected between ground and the junction point 36. The junction point 36 is connected to the power amplifier 20 by way of a capacitor 42. The capacitor 42 is connected by a resistor 44 to ground. In this version of the prior art, the slopes of the input RF signal 10 are modulated to create a small amount of phase shift. The modified RF output signal is digitized and transformed back to a logic level. Consequently, a simulated phase shift is created.

The tuning diode CR1 is the heart of the circuit and its body capacitance changes proportionally to the voltage applied across it. A variable low pass filter comprised of resistor R1 and diode CR1 is created by varying the control signal $V_c$. This variable low pass filter modifies the slope of the incoming RF signal to create a virtual phase shift by tilting the slopes of the rising and falling edges to obtain the RF output signal as shown at 50. The control is limited because the control level ($V_c$) is filtered through a low pass filter which creates group delay and limited bandwidth.

Reference is now made to FIG. 2 which illustrates another prior art circuit for use in shifting the phase of an RF signal. This circuit is similar to that of FIG. 1 and to simplify the description herein similar components are identified in both figures with the same character references and only the differences will be discussed below.

In FIG. 2, the phase control shifting circuit includes a differential amplifier 60 including a pair of NPN transistors 62 and 64 having their emitters connected together in common and, thence, through a resistor 66 to the wiper arm 32 of the potentiometer. The base of transistor 62 is connected to the junction of a resistor 70 and a capacitor C1 connected together in series between ground and the collector of the transistor. The base of transistor 64 is connected to ground by a resistor 76 and the collector is connected to a V+ voltage source. The collector of the transistor 62 is connected to resistor R1 and by way of a capacitor 42 it is also connected to the input of the power amplifier 20. The capacitor 42 is connected to ground by way of resistor 74. The control voltage $V_c$ obtained from the potentiometer is used to control the current gain of the transistors and, in turn, the current flow through the capacitor C1. By varying the current through capacitor C1, a variable low pass filter is created comprised of resistor R1 and capacitor C1. This variable low pass filter modifies the slope of the incoming RF signal and creates a virtual phase shift by tilting the slopes of the rising and falling edges of the RF output signal 50.

The output duty cycle (mark to space ratio) in the circuits of FIGS. 1 and 2 is not directly proportional to the input signal because the RF output signal is AC-coupled and this removes the DC information on the original RF input signal causing a level shift of the RF output signal.

Also, the circuits shown in FIGS. 1 and 2 have very limited dynamic range of adjustments because while the slope of the signal is gradually changed, the envelop of the signal is also gradually changed. The acceptable range of phase modulation is on the order of one tenth of an RF wavelength.

SUMMARY OF THE INVENTION

It is an object of the present invention to provide means for shifting the phase of an RF signal to obtain a phase shifted output signal while maintaining the duty cycle of the RF input signal.

In accordance with the present invention, apparatus and method are provided for varying the phase of an RF signal. An RF source provides an RF signal made up of a first train of pulses exhibiting a fixed frequency and fixed duty pulse cycle and wherein each pulse is of a fixed amplitude and duration. The modulator includes an integrator for converting each pulse cycle of the RF signal into a dual slope symmetrical ramp signal which varies in magnitude from a minimum level to a maximum level and then back to the minimum level for each pulse cycle. A first level signal and a second level signal are provided and are equally spaced from a reference level which is midway between the minimum and maximum levels of the ramp signal. A dual slope comparator compares the ramp signal with the first and second level signals and provides a first pulse signal for a time duration corresponding with the time duration that the ramp signal exceeds the first level signal and a second pulse signal for a time duration corresponding with the time duration that the second level signal exceeds the ramp signal. First and second pulse generators respectively receive the first and second pulse signals and provide first and second trigger pulses. A bistable circuit responds to the first and second trigger pulses to be in respective first and a second states and provides an output RF signal made up of a second train of pulses shifted in phase from the first train by an amount related to the magnitude of the first level signal or the second level signal.

BRIEF DESCRIPTION OF THE DRAWINGS

The foregoing and other objects and advantages of the present invention will become more readily apparent from the following description as taken in conjunction with the accompanying drawings, wherein:

FIG. 3 is a schematic-block diagram illustration of one embodiment of the present invention;

DESCRIPTION OF THE PREFERRED EMBODIMENT

Figure 1:
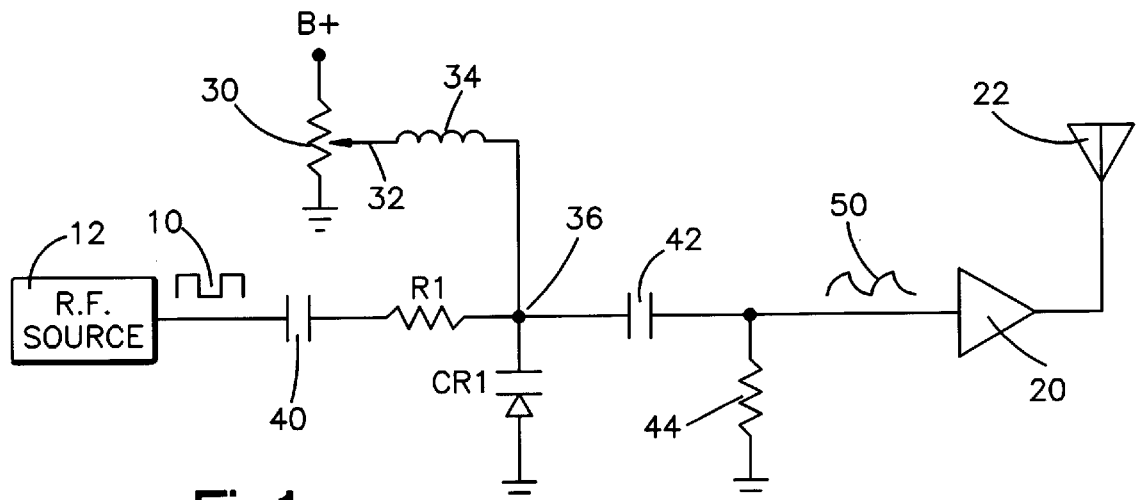
FIG. 1 is a prior art schematic-block diagram illustration of an RF amplifier system employing phase shifting circuitry.
Figure 2:
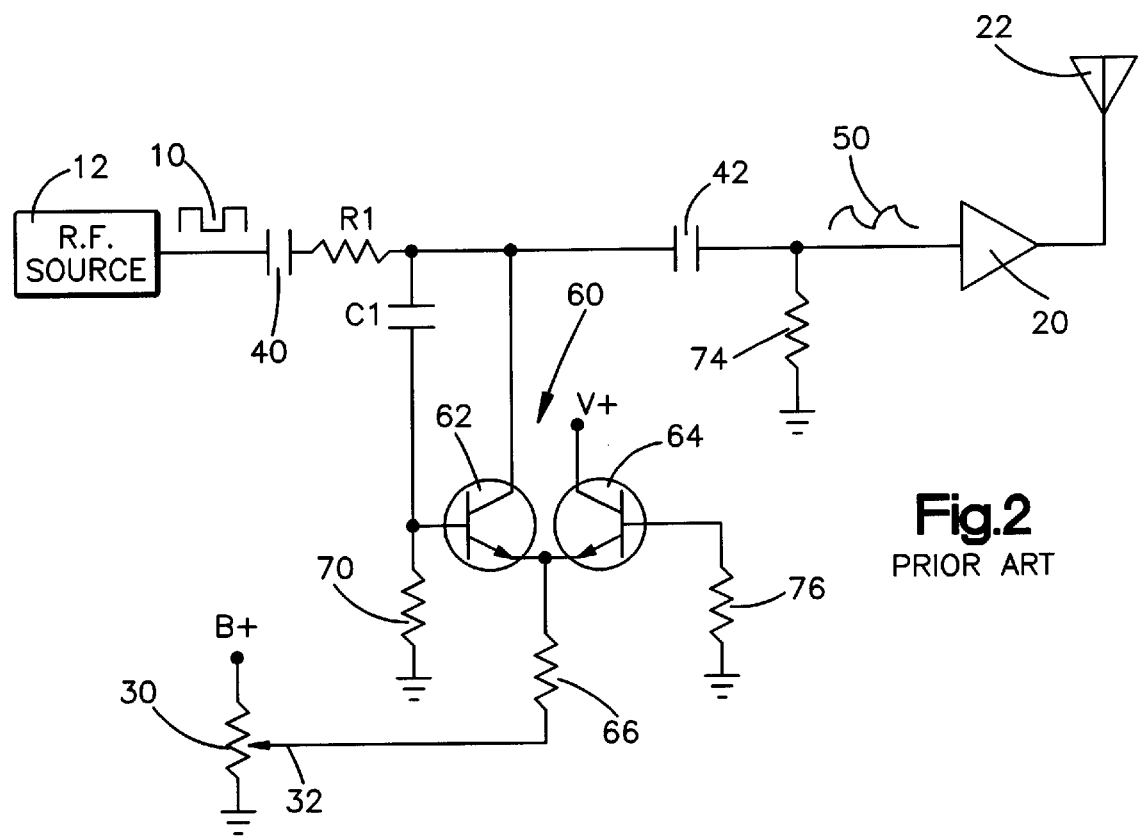
FIG. 2 is another prior art schematic-block diagram of an RF amplifying system employing phase shifting circuitry.

Reference is now made to FIG. 3 which illustrates a first embodiment of the invention. In this embodiment, various components are similar to those in FIGS. 1 and 2 and consequently like character references will be employed with only the differences being described in detail. In this embodiment, the RF input signal is obtained from an RF source and this signal is made up of an input train of pulses exhibiting a fixed frequency and a fixed duty pulse cycle and wherein each pulse is of a fixed amplitude and duration. This RF input signal is supplied to the dual slope modulator 100 constructed in accordance with the present invention. This modulator includes a linear integrator 102, a dual slope comparator 104, a pair of pulse generators 106 and 108 and an S-R flip-flop 110 which provides the output RF signal which is then amplified by a suitable power amplifier 20 and transmitted by way of an antenna 22.

In the embodiment illustrated, the circuit is able to provide a fixed and dynamic phase shift up to one-half of an RF wavelength ($\lambda/2$). The output phase shift Td (see FIGS. 5 and 6) is directly proportional to the input phase shift control signal $V_c$. It should be noted that the input phase control is wideband in its operation without any low pass filtering that would limit the frequency response of the phase modulation requirement as in the case of the prior art described herein with reference to FIGS. 1 and 2.

Figure 5:
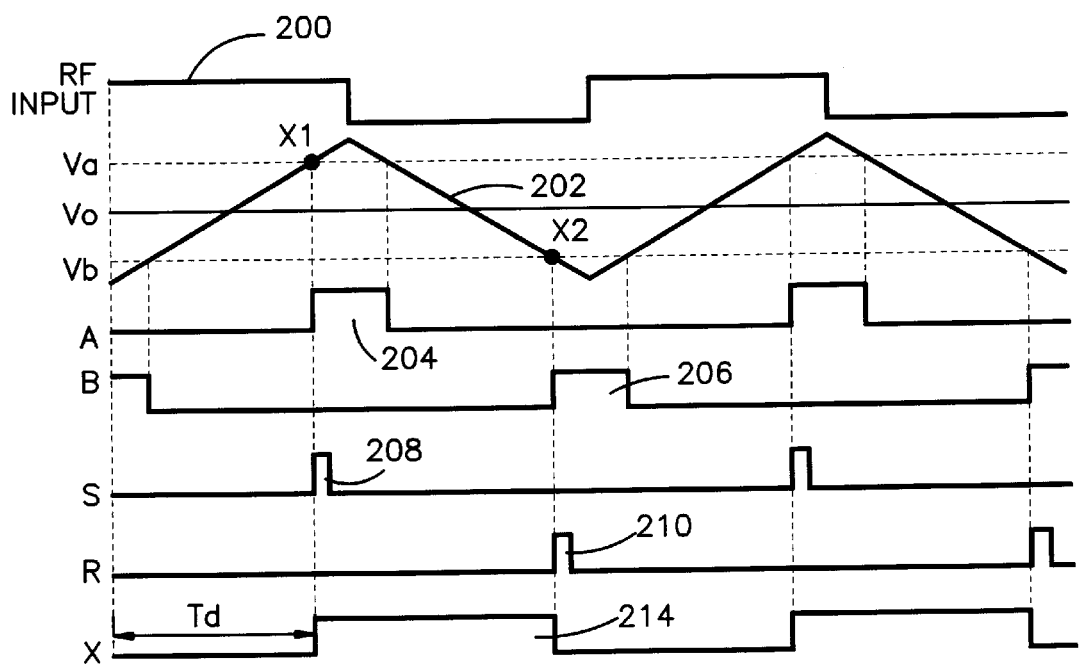
FIG. 5 is a graphical illustration similar to that of FIG. 4 but showing additional aspects of the operation herein; and, FIG. 6 is a schematic-block diagram illustration of a second embodiment of the present invention.

As shown in FIG. 3, the input RF signal, having a waveform 200 as shown in FIG. 5, is supplied to the integrator 102. This is a linear integrator that converts each pulse cycle of the RF signal into a dual slope symmetrical ramp signal, having a waveform 202 as shown in FIG. 5. This ramp signal varies in magnitude from a minimum level to a maximum level and then back to the minimum level for each pulse cycle (refer to FIG. 5).

The control level signal $V_c$ is applied through an amplifier 112 to the negative or inverting input of an operational amplifier 114. The output from the integrator 102 is applied across a divider circuit including a resistor 116 and a capacitor 118 to ground. A reference voltage level $V_0$ is taken at the junction of the resistor 116 and capacitor 118 and this voltage is applied to the positive or non-inverting input of the operational amplifier 114. The output taken from amplifier 112, voltage $V_a$, is supplied to the negative or inverting input of an operational amplifier serving as a voltage comparator 120 in the dual slope comparator 104. The output voltage $V_b$ of operational amplifier 114 is supplied to the positive input of an operational amplifier taking the form of a voltage comparator 122 in the dual slope comparator 104. The ramp voltage obtained from the integrator 102 is supplied to the positive input of comparator 120 and to the negative input of comparator 122. It is to be noted that the voltage $V_a$ obtained from amplifier 112 and the voltage $V_b$ obtained from amplifier 114 are equally spaced in opposite directions from the reference voltage $V_0$ (see the waveforms of FIG. 5). Also the reference level voltage of $V_0$ is midway between the minimum and maximum levels of the ramp signal 202 (see the waveform in FIG. 5).

The dual slope comparator 104 compares the ramp voltage obtained from integrator 102 with the first and second level signals $V_a$ and $V_b$ and provides a first pulse signal A and a second pulse signal B. Pulse signal A has a time duration corresponding with the time duration that the ramp signal exceeds the first level signal $V_a$. A second pulse signal B is provided for a time duration corresponding with the time duration that the second level signal $V_b$ exceeds the ramp signal.

More specifically, it will be noted from FIGS. 3 and 5 that the dual slope comparator 104 includes three input ports and two output ports that are interfaced between the integrator 102, the phase shift control and the output pulse generators 106 and 108. As shown in FIG. 5 at waveform 204, the output of comparator 120 is a logic high signal A so long as the ramp signal is greater than the first level signal $V_a$. Similarly, as shown in waveform 206 in FIG. 5, the output of comparator 122 will be at a logic high signal B so long as the second level signal $V_b$ is greater than the ramp signal. It will be noted that signals $V_a$ and $V_b$ are tracked together and are in opposite directions relative to the voltage reference $V_o$ (see FIG. 5). The dual level sampling ensures the recreation of the duty cycle of the original signal. The reference level $V_0$ is zero when the duty cycle of the RF input is 50%. The first level signal $V_a$ is adjustable between the peak-to-peak levels of the ramp voltage (see FIG. 5). Also, it is to be noted that:

$$V_b = 2V_0 - V_a \qquad \text{(Equation 1)}$$

The pulse generators 106 and 108 are respectively triggered by the leading edges of the positive output pulses A and B taken from comparators 120 and 122 respectively. Thus each SET pulse, such as in the waveform 208 in FIG. 5, is triggered by the leading edge of signal A. The SET pulse is of short duration but is of a width sufficient to trigger an S-R flip-flop 110 to be discussed below. Similarly, the RESET pulse R obtained from pulse generator 108 is illustrated by the waveform 210 in FIG. 5.

A bistable circuit taking the illustrative form an S-R flip-flop 110 includes a pair of logic gates 130 and 132 connected as shown and providing an output signal X, as shown by the waveform 214 in FIG. 5, to the power amplifier 20 for transmitting an RF signal by way of the antenna 22. The SET and RESET ports of flip-flop 110 respectively receive trigger pulses from the pulse generators 106 and 108 to change from one state to the other. The output signal X corresponds in duty cycle with the original RF input signal as will be noted by comparing the waveform 214 of the output signal X with the waveform 200 of the RF input signal (see FIG. 5). It will be noted that the output signal X is shifted by a phase delay Td. This time or phase delay is linearly proportional to the phase shift control signal $V_c$ obtained from the potentiometer 30 (FIG. 3). It is to be noted that the circuit can also be used as a delay line with the maximum delay adjustment of one-half wavelength. The output duty cycle is unaffected using this dual slope modulator of FIG. 3.

Figure 4:
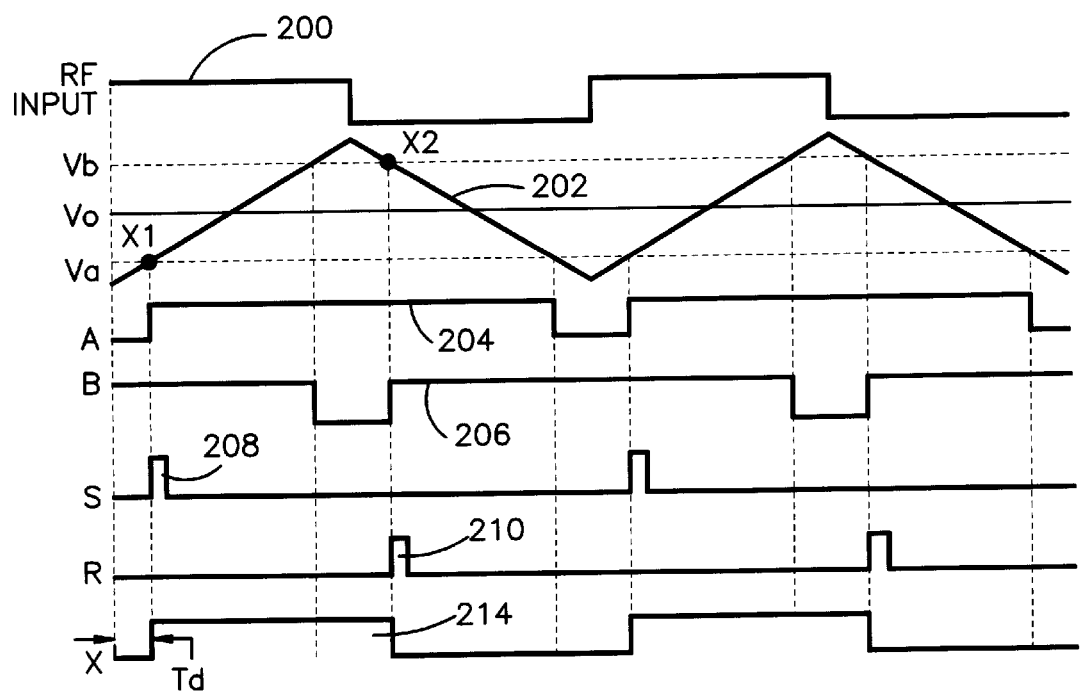
FIG. 4 is a graphical illustration including a plurality of waveforms illustrating the operation of the invention herein.

The waveforms of FIG. 4 illustrate the operation with delay time (Td) up to one-fourth of a wavelength ($\lambda/4$). The sample points x1 and x2 travel on opposite slopes of waveform 202. Reference is now made to the waveforms of FIG. 5 which are similar to those of the waveforms of FIG. 4 and like waveforms are identified with the same character references. In FIG. 5, a larger phase delay is produced wherein the delay time (Td) is greater than $\lambda/4$.

Reference is now made to the embodiment illustrated in FIG. 6. This embodiment is similar to that of the embodiment of FIG. 3 and to simplify the description herein, like components are identified with like character references and only the differences will be described below. This embodiment illustrates an audio input supplied to an input audio buffer 300 and then is supplied to an audio modulating circuit 302 which provides the audio level to the RF power amplifier 20, as well as to a level translator 304. This provides the control signal $V_c$ to the amplifier 112 within the dual slope modulator 100. The output from the modulator 100 is applied through an amplifier 306 to the RF power amplifier 20. The operation of FIG. 6 is the same as that set forth herein below with reference to the embodiment of FIG. 3 and as described relative to the waveforms of FIGS. 4 and 5.

Although the foregoing has been described in conjunction with preferred embodiments, it is to be appreciated that various modifications may be made without departing from the spirit and the scope of the invention as defined by the appended claims.

The following is claimed:

1. An RF amplifier system having a phase modulator for varying the phase of an RF signal, comprising:
    an RF source for providing an RF signal made up of a first train of pulses exhibiting a fixed frequency and fixed duty pulse cycle and wherein each pulse is of a fixed amplitude and duration;
    said modulator including:
    integrating means for converting each pulse cycle of said RF signal into a dual slope symmetrical ramp signal which varies in magnitude from a minimum level to a maximum level and then back to said minimum level for each pulse cycle;
    means for providing a first level signal and a second level signal equally spaced from a reference level wherein said reference level is midway between said minimum and maximum levels of said ramp signal;
    dual slope comparing means for comparing said dual slope ramp signal with said first and second level signals and providing a first pulse signal for a time duration corresponding with the time duration that said ramp signal exceeds said first level signal and a second pulse signal for a time duration corresponding with the time duration that said second level signal exceeds said ramp signal;
    first and second pulse generators for respectively receiving said first and second pulse signals and providing therefrom first and second trigger pulses;
    bistable means responsive to said first and second trigger pulses to be in respective first state in response to a first trigger pulse and a second state in response to a second trigger pulse and providing an output RF signal made up of a second train of pulses of said fixed frequency and said fixed duty cycle of said first pulse train and being shifted in phase therefrom by an amount related to the magnitude of said first level signal or said second level signal.

2. A system as set forth in claim 1 wherein said integrating means is a linear integrator such that said ramp signal varies linearly in magnitude.

3. A system as set forth in claim 1 wherein said means for providing said first and second level signals includes means for providing a control level signal and means for varying the magnitude of said control level signal in accordance with the desired variation in the phase of the RF signal.

4. A system as set forth in claim 3 including circuitry for providing said first and second level signals from said control level signal.

5. A system as set forth in claim 4 wherein said circuitry includes a first amplifier for receiving said control level signal and providing therefrom said first level signal.

6. A system as set forth in claim 5 including a second amplifier coupled to said integrating means and said first amplifier for providing said second level signal.

7. A system as set forth in claim 6 wherein said integrating means is a linear integrator such that said ramp signal varies linearly in magnitude.

8. A system as set forth in claim 1 wherein said dual slope comparing means includes a first comparator for comparing said ramp signal with said first level signal and providing said first pulse signal.

9. A system as set forth in claim 8 wherein said dual slope comparing means includes a second comparator for comparing said second level signal with said ramp signal and providing said second pulse signal.

10. A system as set forth in claim 9 wherein said integrating means is a linear integrator such that said ramp signal varies linearly in magnitude.

11. A system as set forth in claim 9 wherein said means for providing said first and second level signals includes means for providing a control level signal and means for varying the magnitude of said control level signal in accordance with the desired variation in the phase of the RF signal.

12. A system as set forth in claim 9 including circuitry for providing said first and second level signals from said control level signal.

13. A system as set forth in claim 9 wherein said circuitry includes a first amplifier for receiving said control level signal and providing therefrom said first level signal.

14. A system as set forth in claim 9 including a second amplifier coupled to said integrating means and said first amplifier for providing said second level signal.

15. A system as set forth in claim 14 wherein said integrating means is a linear integrator such that said ramp signal varies linearly in magnitude.

16. A system as set forth in claim 1 wherein said bistable means is an S-R flip-flop having a set state and a reset state respectively in response to said first and second trigger pulses.

17. A system as set forth in claim 16 wherein said first and second trigger pulses are set and reset pulses.

18. A system as set forth in claim 17 wherein said integrating means is a linear integrator such that said ramp signal varies linearly in magnitude.

19. A system as set forth in claim 18 wherein said means for providing said first and second level signals includes means for providing a control level signal and means for varying the magnitude of said control level signal in accordance with the desired variation in the phase of the RF signal.

20. A system as set forth in claim 19 including circuitry for providing said first and second level signals from said control level signal.

21. A system as set forth in claim 20 wherein said circuitry includes a first amplifier for receiving said control level signal and providing therefrom said first level signal.

22. A system as set forth in claim 21 including a second amplifier coupled to said integrating means and said amplifier for providing said second level signal.

23. A system as set forth in claim 22 wherein said dual slope comparing means includes a first comparator for comparing said ramp signal with said first level signal and providing said first pulse signal.

24. A system as set forth in claim 23 wherein said dual slope comparing means includes a second comparator for comparing said second level signal with said ramp signal and providing said second pulse signal.

25. An RF amplifier system having a phase modulator for varying the phase of an RF signal, comprising:

an RF source for providing an RF signal made up of a first train of pulses exhibiting a fixed frequency and fixed duty pulse cycle and wherein each pulse is of a fixed amplitude and duration;

said modulator including:

an integrator connected to said RF source converting each pulse cycle of said RF signal into a dual slope symmetrical ramp signal which varies in magnitude from a minimum level to a maximum level and then back to said minimum level for each pulse cycle;

a first level signal and a second level signal equally spaced from a reference level wherein said reference level is midway between said minimum and maximum levels of said ramp signal;

dual slope comparator receiving said first and second level signals and said ramp signal and providing a first pulse signal for a time duration corresponding with the time duration that said ramp signal exceeds said first level signal and a second pulse signal for a time duration corresponding with the time duration that said second level signal exceeds said ramp signal;

first and second pulse generators coupled to said dual slope comparator and respectively receiving said first and second pulse signals and providing therefrom first and second trigger pulses;

a bistable circuit connected to said first and second pulse generators and responsive to said first and second trigger pulses to be in respective first state in response to a first trigger pulse and a second state in response to a second trigger pulse and providing an output RF signal made up of a second train of pulses of said fixed frequency and said fixed duty cycle of said first pulse train and being shifted in phase therefrom by an amount related to the magnitude of said first level signal or said second level signal.

26. A system as set forth in claim 25 wherein said integrator is a linear integrator such that said ramp signal varies linearly in magnitude.

27. A system as set forth in claim 25 including control level signal circuitry providing a control level signal and means for varying the magnitude of said control level signal in accordance with the desired variation in the phase of the RF signal.

28. A system as set forth in claim 27 including circuitry for providing said first and second level signals from said control level signal.

29. A system as set forth in claim 28 wherein said circuitry includes a first amplifier for receiving said control level signal and providing therefrom said first level signal.

30. A system as set forth in claim 29 including a second amplifier coupled to said integrator and said first amplifier for providing said second level signal.

31. A system as set forth in claim 25 wherein said dual slope comparator includes a first comparator for comparing said ramp signal with said first level signal and providing said first pulse signal.

32. A system as set forth in claim 31 wherein said dual slope comparator includes a second comparator for comparing said second level signal with said ramp signal and providing said second pulse signal.

33. A system as set forth in claim 25 wherein said bistable circuit is an S-R flip-flop having a set state and a reset state respectively in response to said first and second trigger pulses.

34. A system as set forth in claim 33 wherein said first and second trigger pulses are set and reset pulses.

35. A system as set forth in claim 34 wherein said integrator is a linear integrator such that said ramp signal varies linearly in magnitude.

36. A method of varying the phase of an RF signal that is made up of a first train of pulses exhibiting a fixed frequency and fixed duty pulse cycle and wherein each pulse is of a fixed amplitude and duration, said method including the steps of:

integrating the RF signal by converting each pulse cycle of said RF signal into a dual slope symmetrical ramp signal which varies in magnitude from a minimum level to a maximum level and then back to the minimum level for each pulse cycle;

providing a control level signal having a magnitude representing the desired phase shift of said RF signal and developing from said control level signal a first level signal and a second level signal that are equally spaced from a reference level which is midway between the minimum and maximum levels of the lamp signal;

comparing the first and second level signals with a ramp signal and providing a first pulse signal for a time duration corresponding with the time duration that the ramp signal exceeds the first level signal and a second pulse signal for a time duration corresponding with the time duration that the second level signal exceeds the ramp signal;

providing first and second trigger pulses in response to the respective first and second pulse signals; and, operating a bistable circuit in response to the first and second trigger pulses so that said bistable circuit is in respective first and second states in response to said first and second trigger pulses and providing an RF signal dependent on the operation of said bistable circuit so that the output RF signal is made up of a second train of pulses of said fixed frequency and said fixed duty cycle of said first pulse train and being shifted in phase therefrom by an amount related to the magnitude of said control level signal.

37. A method as set forth in claim 36 wherein said step of integrating includes linearly integrating said RF signal so that said ramp signal varies linearly in magnitude.

* * * * *